(12) United States Patent
Lim et al.

(10) Patent No.: US 11,150,691 B2
(45) Date of Patent: Oct. 19, 2021

(54) DISPLAY DEVICE AND METHOD FOR MANUFACTURING THE SAME

(71) Applicant: Samsung Display Co., LTD., Yongin-si (KR)

(72) Inventors: Hyungjun Lim, Asan-si (KR); Hee Sun Ahn, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/853,213

(22) Filed: Apr. 20, 2020

(65) Prior Publication Data

US 2020/0393872 A1    Dec. 17, 2020

(30) Foreign Application Priority Data

Jun. 17, 2019    (KR) .................. 10-2019-0071459

(51) Int. Cl.
*H01L 51/52*    (2006.01)
*G06F 1/16*    (2006.01)
*H01L 51/56*    (2006.01)

(52) U.S. Cl.
CPC .......... *G06F 1/1609* (2013.01); *G06F 1/1652* (2013.01); *G06F 1/1656* (2013.01); *H01L 51/5281* (2013.01); *H01L 51/56* (2013.01)

(58) Field of Classification Search
CPC .... G06F 1/1609; G06F 1/1656; G06F 1/1652; H01L 51/5281; H01L 51/56
See application file for complete search history.

(56) References Cited

U.S. PATENT DOCUMENTS

| | | | | |
|---|---|---|---|---|
| 2008/0142791 A1* | 6/2008 | Kim | ............... | H01L 51/5237 257/40 |
| 2014/0179040 A1* | 6/2014 | Ramadas | ............... | B32B 27/20 438/27 |
| 2016/0093833 A1* | 3/2016 | No | ............... | H01L 51/5293 257/40 |
| 2017/0324060 A1* | 11/2017 | Kim | ............... | G02B 5/208 |
| 2019/0098742 A1 | 3/2019 | Takahashi et al. | | |
| 2019/0098767 A1 | 3/2019 | Hasegawa et al. | | |
| 2019/0355763 A1* | 11/2019 | Chen | ............... | H01L 27/3262 |

FOREIGN PATENT DOCUMENTS

| | | | | |
|---|---|---|---|---|
| CN | 108598278 A | * | 9/2018 | ............ H01I 51/52 |
| CN | 109037460 A | * | 12/2018 | ............ H01L 51/52 |
| KR | 10-2015-0001142 | | 1/2015 | |
| KR | 10-2015-0048547 | | 5/2015 | |
| KR | 10-2015-0053084 | | 5/2015 | |
| KR | 10-2015-0059566 | | 6/2015 | |
| KR | 10-2015-0077829 | | 7/2015 | |
| KR | 10-1923716 | | 11/2018 | |
| WO | WO-2019109674 A1 | * | 6/2019 | ......... H01L 27/3272 |

\* cited by examiner

*Primary Examiner* — Donald L Raleigh
(74) *Attorney, Agent, or Firm* — Kile Park Reed & Houtteman PLLC

(57) ABSTRACT

A display device includes a panel part and a protective window on the panel part. The panel part includes a base substrate, a supporting film disposed below the base substrate, a driving element disposed on the base substrate, the driving element including an active pattern, and a UV-blocking member disposed below the driving element.

17 Claims, 10 Drawing Sheets

DISPLAY DEVICE AND METHOD FOR MANUFACTURING THE SAME

CROSS-REFERENCE TO RELATED APPLICATION(S)

This application claims priority to and benefits of Korean Patent Application No. 10-2019-0071459 under 35 U.S.C. § 119, filed on Jun. 17, 2019 in the Korean Intellectual Property Office, the entire contents of which are incorporated herein by reference.

BACKGROUND

1. Technical Field

Embodiments relate to a display device. Embodiments relate to a display device including a UV-blocking member or structure and a method for manufacturing a display device including a bending portion.

2. Description of the Related Art

Research and development are currently being conducted for a display device having a bending portion (or a curved portion) to improve a design and an applicability of a UV-blocking structure of a display device.

Thus, a method for effectively forming a bending portion of a display device is required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a UV-blocking member or structure.

Embodiments provide a method for manufacturing a display device including a bending portion.

According to an embodiment, a display device may include a panel part and a protective window disposed on the panel part. The panel part may include a base substrate, a supporting film disposed below the base substrate, a driving element disposed on the base substrate, the driving element including an active pattern, and a UV-blocking member disposed below the driving element.

In an embodiment, the UV-blocking member may include at least one selected from the group consisting of a metal oxide, a dye, a pigment and a carbon-based light-blocking material.

In an embodiment, the UV-blocking member may include a UV-blocking layer combined with at least one surface of the supporting film.

In an embodiment, the UV-blocking member may include UV-blocking particles dispersed in the supporting film.

In an embodiment, the UV-blocking member may include a UV-blocking layer disposed on a lower surface of the base substrate.

In an embodiment, the UV-blocking member may include UV-blocking particles dispersed in the base substrate.

In an embodiment, the panel part may include a buffer layer disposed between the base substrate and the active pattern. The UV-blocking member may include a UV-blocking layer disposed between the buffer layer and the base substrate.

In an embodiment, the panel part may include a buffer layer disposed between the base substrate and the active pattern. The buffer layer may include an upper buffer layer and a lower buffer layer. The UV-blocking member may include a UV-blocking layer disposed between the upper buffer layer and the lower buffer layer.

In an embodiment, the UV-blocking member may include at least one selected from the group consisting of zinc oxide and titanium oxide.

In an exemplary embodiment, the display device may include a front portion having a flat shape and a side portion including a curved or bent shape.

The supporting film may include at least one UV-blocking layer.

According to an embodiment, a method for manufacturing a display device may be provided. The method may include disposing a UV-blocking member in a panel part of the display device, combining the panel part with a guide film by a guide adhesive member; placing a lower surface of the guide film on a seating pad; forming a bending portion of the panel part by pressing the guide film to an upper surface and a side surface of the seating pad; combining the panel part with a protective window; separating the seating pad from the guide film; irradiating a UV ray onto the guide adhesive member through the lower surface of the guide film; and separating the guide film from the panel part.

The method may further include providing a groove at a side surface of the seating pad, wherein ends of the guide film may be guided by the groove to form the bending portion.

The method may further include forming the seating pad such that the upper surface may have a flat shape and the side surface may have a curved shape.

The disposing the UV-blocking member may include preparing the UV-blocking member to include at least one selected from the group consisting of a metal oxide, a dye, a pigment and a carbon-based light-blocking material.

The method may further include disposing a supporting film in the panel part; and disposing a UV-blocking layer on a surface of the supporting film to include the UV-blocking layer in the UV-blocking member.

The method may further include disposing a supporting film in the panel part; and dispersing UV-blocking particles in the supporting film to include the UV-blocking particles in the UV-blocking member.

The method may further include disposing a base substrate in the panel part; and disposing a UV-blocking layer on a surface of the base substrate to include the UV-blocking layer in the UV-blocking member.

The method may further include disposing a base substrate in the panel part; and dispersing UV-blocking particles in the base substrate to include the UV-blocking particles in the UV-blocking member.

The method may further include disposing a buffer layer between a base substrate and an active pattern included in the panel part; and disposing a UV-blocking layer between the buffer layer and the base substrate to include the UV-blocking layer in the UV-blocking member.

The method may further include disposing a buffer layer between a base substrate and an active pattern included in the panel part, wherein the buffer layer may include an upper buffer layer and a lower buffer layer; and disposing a UV-blocking layer between the upper buffer layer and the lower buffer layer to include the UV-blocking layer in the UV-blocking member.

According to embodiments, a UV-blocking member may be provided or disposed under an active pattern of a display device. Thus, deterioration of a driving element including the active pattern due to a UV ray may be prevented.

BRIEF DESCRIPTION OF THE DRAWINGS

Aspects of one or more embodiments will be more clearly understood from the following detailed description taken in conjunction with the accompanying drawings.

DETAILED DESCRIPTION OF THE EMBODIMENTS

Figure 1:
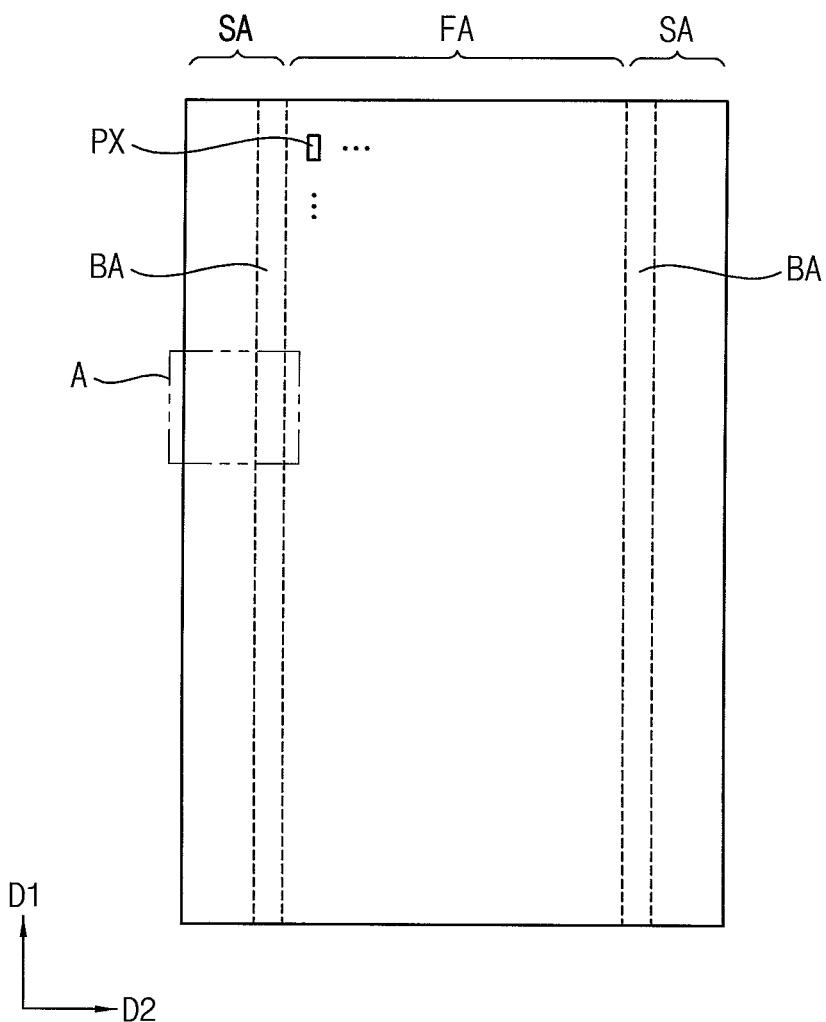
FIG. 1 is a plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
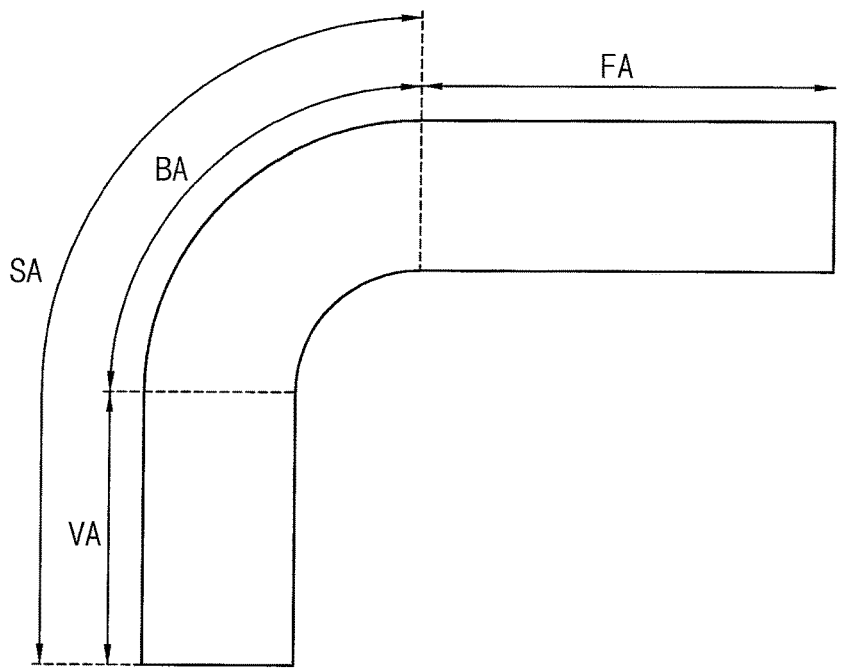
FIGS. 2 and 3 are lateral views illustrating a display device according to embodiments.
Figure 3:
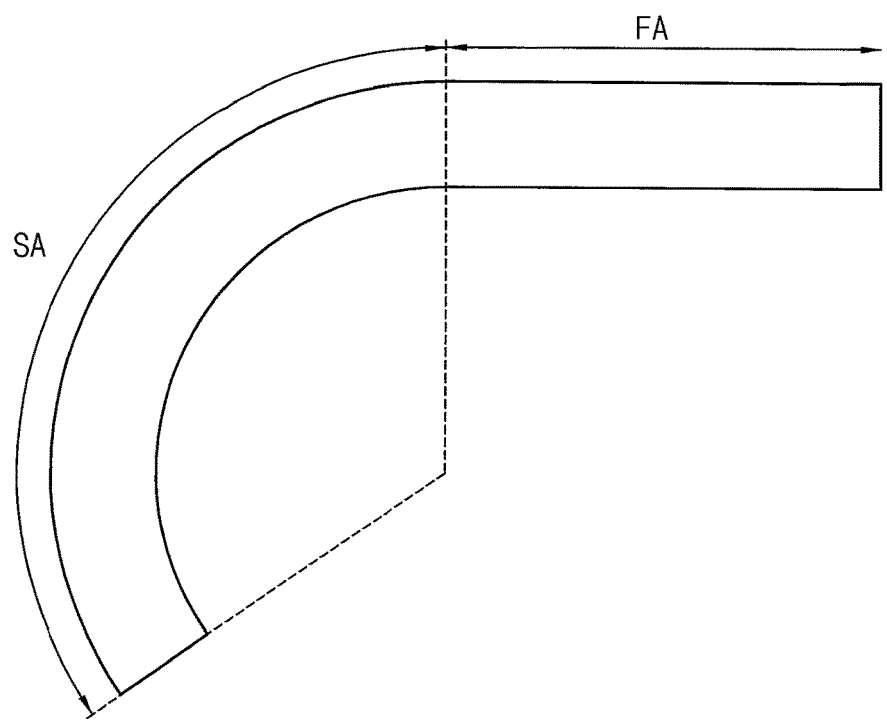

FIG. 1 is a plan view illustrating a display device according to an embodiment. FIGS. 2 and 3 are lateral views illustrating a display device according to embodiments. For example, FIGS. 2 and 3 may illustrate the region CA' of FIG. 1.

Referring to FIGS. 1 and 2, a display device 10 according to an embodiment may include a front portion FA and a side portion SA, or side portions SA as shown in FIG. 1. The display device 10 may be partially curved or bent to have the side portion SA. For ease of explanation, FIG. 1 may illustrate a display device, which is not bent.

The front portion FA may have a flat shape. For example, the front portion FA may extend along a horizontal direction. An array of pixels PX may be disposed in the front portion FA to emit light in response to a driving signal.

In an embodiment, the side portion SA may include a bending portion BA and a vertical portion VA extending from the bending portion BA along a vertical direction. For example, the bending portion BA may have a curvature with respect to an axis extending along a first direction D1.

An array of pixels PX may be disposed in the bending portion BA and the vertical portion VA to be included as part of a display area. However, embodiments are not limited thereto. For example, at least one of the bending portion BA and the vertical portion VA may be a non-display area that may not include an array of pixels.

Referring to FIG. 3, a side portion SA of a display device 20 may be entirely curved. The side portion SA may or may not include an array of pixels.

Figure 4:
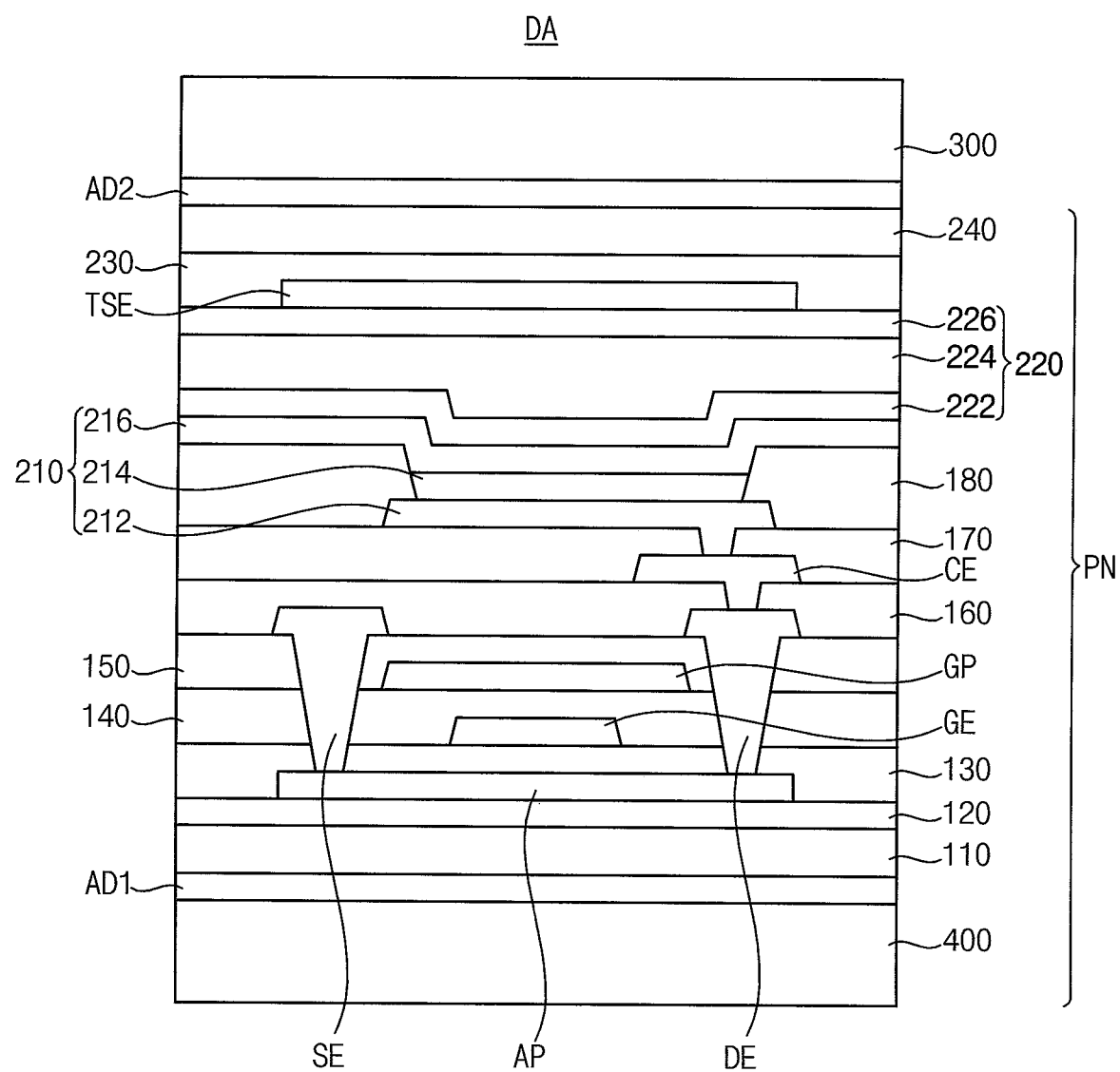
FIG. 4 is a schematic cross-sectional view illustrating a display device according to an embodiment.

FIG. 4 is a schematic cross-sectional view illustrating a display device according to an embodiment. FIG. 4 may illustrate a display area DA including pixels PX.

Referring to FIG. 4, a pixel unit disposed in the display area DA may include a driving element and a light-emitting element electrically connected to the driving element, which may be disposed on a base substrate 110. In an embodiment, the light-emitting element may be an organic light-emitting diode.

A supporting film 400 may be disposed on a lower surface of, or below, the base substrate 110. The supporting film 400 may be combined with the base substrate 110 by a lower adhesive member AD1. The lower adhesive member AD1 may be an adhesive or an adhesive film, which may include an acryl resin or other suitable materials within the spirit and the scope of the disclosure. In an embodiment, the supporting film 400 may be patterned to reduce stress in a bending portion by folding. For example, the supporting film 400 may include a polymeric material such as polymethylmethacrylate (PMMA), polycarbonate (PC), polyethyleneterephthalate (PET) or other suitable materials within the spirt and the scope of the disclosure.

A buffer layer 120 may be disposed on the base substrate 110. An active pattern AP may be disposed on the buffer layer 120.

For example, the base substrate 110 may be formed of a polymeric material to have a high flexibility. For example, the base substrate 110 may include polyethylene terephthalate, polyethylene naphthalate, polyether ketone, polycarbonate, polyarylate, polyether sulfone, polyimide or a combination thereof. In an embodiment, the base substrate 110 may include a rigid material such as glass, quartz, sapphire or other suitable rigid materials within the spirt and the scope of the disclosure.

The buffer layer 120 may prevent or reduce the permeation of impurities, humidity, or external gas(es) from underneath of the base substrate 110, and may planarize an upper surface of the base substrate 110. For example, the buffer layer 120 may include an inorganic material such as silicon oxide, silicon nitride, silicon carbide or a combination thereof.

A gate electrode GE may be disposed on the active pattern AP. A first insulation layer 130 may be disposed between the active pattern AP and the gate electrode GE.

A gate wiring pattern GP may be disposed on the gate electrode GE. The gate wiring pattern GP may include a capacitor electrode for forming a capacitor, a wiring for transferring various signals or other electrodes or wirings or other elements.

A second insulation layer 140 may be disposed between the gate electrode GE and the gate wiring pattern GP. A third insulation layer 150 may be disposed on the gate wiring pattern GP.

For example, the active pattern AP may include silicon or a metal oxide semiconductor. In an embodiment, the active pattern AP may include polycrystalline silicon (polysilicon), which may be doped with n-type impurities or p-type impurities.

In an embodiment or with respect to a transistor that may not be illustrated, an active pattern may include a metal oxide semiconductor. For example, the active pattern may include a two-component compound (ABx), a ternary compound (ABxCy) or a four-component compound (ABxCyDz), which may contain indium (In), zinc (Zn), gallium (Ga), tin (Sn), titanium (Ti), aluminum (Al), hafnium (Hf), zirconium (Zr), or magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or other suitable materials for the active pattern within the spirit and the scope of the disclosure.

The first insulation layer 130, the second insulation layer 140 and the third insulation layer 150 may include silicon oxide, silicon nitride, silicon carbide or a combination thereof. As an example, the first insulation layer 130, the second insulation layer 140 and the third insulation layer 150 may include an insulating metal oxide such as aluminum oxide, tantalum oxide, hafnium oxide, zirconium oxide, titanium oxide or other suitable oxide(s) within the spirit and the scope of the disclosure. For example, the first insulation layer 130, the second insulation layer 140 and the third insulation layer 150 may have a single-layered structure or a multiple-layered structure including silicon nitride and/or silicon oxide, respectively, or may have different structures from each other.

The gate electrode GE and the gate wiring pattern GP may include a metal, a metal alloy, a metal nitride, a conductive metal oxide or other suitable materials within the spirit and the scope of the disclosure. For example, the gate electrode GE and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers. In an embodiment, the gate electrode GE and the gate wiring pattern GP may have a multiple-layered structure including at least a molybdenum layer.

A first source metal pattern may be disposed on the third insulation layer 150. The first source metal pattern may include a source electrode SE and a drain electrode DE, which may contact the active pattern AP. The source electrode SE and the drain electrode DE may pass through the insulation layers disposed thereunder to contact the active pattern AP, respectively.

A fourth insulation layer 160 may be disposed on the first source metal pattern. A second source metal pattern may be disposed on the fourth insulation layer 160. The second source metal pattern may include a connection electrode CE that may electrically connect the drain electrode DE to an organic light-emitting diode 210 disposed thereon. In an embodiment, the second source metal pattern may include a mesh power line that may prevent a voltage drop of a power applied to the organic light-emitting diode 210. A fifth insulation layer 170 may be disposed on the second source metal pattern.

The first and second source metal patterns may include a metal, a metal alloy, a metal nitride, a conductive metal oxide or other suitable materials within the spirit and the scope of the disclosure. For example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers. In an embodiment, the first and second source metal patterns may have a multiple-layered structure including at least an aluminum layer. For example, the first and second source metal patterns may have a stacked structure of an aluminum layer and a titanium layer.

The fourth insulation layer 160 and the firth insulation layer 170 may include an organic material. For example, the fourth insulation layer 160 and the firth insulation layer 170 may include an organic insulation material such as a phenol resin, an acryl resin, a polyimide resin, a polyamide resin, a silioxane resin, an epoxy resin or other organic insulation materials within the spirit and the scope of the disclosure.

The organic light-emitting diode 210 may be disposed on the fifth insulation layer 170. The organic light-emitting diode 210 may include a first electrode 212 electrically contacting the connection electrode CE, a light-emitting layer 214 disposed on the first electrode 212 and a second electrode 216 disposed on the light-emitting layer 214. The light-emitting layer 214 of the organic light-emitting diode 210 may be disposed in an opening of a pixel-defining layer 180 disposed on the fifth insulation layer 170. The first electrode 212 may be a lower electrode of the organic light-emitting diode 210, and the second electrode 216 may be an upper electrode of the organic light-emitting diode 210.

The first electrode 212 may function as an anode, however, the disclosure is not limited thereto. For example, the first electrode 212 may be formed as a transmitting electrode or a reflecting electrode according to an emission type of the display device. When the first electrode 212 is a transmitting electrode, the first electrode 212 may include indium tin oxide, indium zinc oxide, zinc tin oxide, indium oxide, zinc oxide, tin oxide or other oxides. When the first electrode 212 is a reflecting electrode, the first electrode 212 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a material that may be used for the transmitting electrode.

The pixel-defining layer 180 may have an opening exposing at least a portion of the first electrode 212. For example, the pixel-defining layer 180 may include an organic insulating material.

The light-emitting layer 214 may include at least one of a hole injection layer (HIL), a hole transporting layer (HTL), an organic light-emitting layer, an electron transporting layer (ETL) and an electron injection layer (EIL). For example, the light-emitting layer 214 may include a low molecular weight organic compound or a high molecular weight organic compound.

In an embodiment, the light-emitting layer 214 may emit a red light, a green light or a blue light. In an embodiment, the light-emitting layer 214 may emit a white light. The light-emitting layer 214 emitting a white light may have a multiple-layer structure including a red-emitting layer, a green-emitting layer and a blue-emitting layer, or a single-layer structure including a mixture of a red-emitting material, a green-emitting material and a blue-emitting material.

The second electrode 216 may be formed as a transmitting electrode or a reflecting electrode according to an emission type of the display device. For example, when the second electrode 216 is a transmitting electrode, the second electrode 216 may include a metal, a metal alloy, a metal nitride, a metal fluoride, a conductive metal oxide or a combination thereof.

For example, the second electrode 216 may extend continuously across pixels in the display area DA. In an embodiment, a capping layer and a blocking layer may be formed on the second electrode 216.

The display device may include an encapsulation layer 220 covering or overlapping the organic light-emitting diode 210. The encapsulation layer 220 may extend over or to cover or overlap an entire portion of the display area DA.

For example, the encapsulation layer 220 may have a stacked structure of an inorganic thin film and an organic thin film. For example, as illustrated in FIG. 4, the encapsulation layer 220 may include a first inorganic thin film 222, an organic thin film 224 disposed on the first inorganic thin film 222, and a second inorganic thin film 226 disposed on the organic thin film 224. However, embodiments are not limited thereto. For example, the encapsulation layer 220 may have a structure including at least two organic thin films and at least three inorganic thin films.

For example, the organic thin film 224 may include a cured resin such as polyacrylate or other suitable materials within the spirit and the scope of the disclosure. For example, the cured resin may be formed from a cross-linking reaction of monomers. For example, the inorganic thin films 222 and 226 may include an inorganic material such as silicon oxide, silicon nitride, silicon carbide, aluminum oxide, tantalum oxide, hafnium oxide, zirconium oxide, titanium oxide or other suitable materials within the spirit and the scope of the disclosure.

In an embodiment, a touch-sensing part may be disposed on the encapsulation layer 220. The touch-sensing part may sense an input position by contact. The touch-sensing part may be formed directly on the encapsulation layer 220 or may be combined with the encapsulation layer 220 as a screen panel after having been individually manufactured.

For example, a touch-sensing electrode TSE and a touch insulation layer 230 covering the touch-sensing electrode TSE may be disposed on the encapsulation layer 220. For example, the touch-sensing electrode TSE may include a transparent conductive material such as indium tin oxide, indium zinc oxide or other suitable materials within the spirit and the scope of the disclosure.

A polarization layer 240 and a protective window 300 may be disposed on the touch-sensing part. An adhesive agent or a transparent adhesive film may be provided between the polarization layer 240 and the touch-sensing part and between the polarization layer 240 and the protective window 300. For example, a window adhesive member AD2 may be disposed between the protective window 300 and the polarization layer 240.

Hereafter, the structure including the supporting film 400 to the polarization layer 240 may be referred as a panel part PN.

In an embodiment, a display device may include a UV-blocking member or structure that may prevent deterioration of the active pattern AP due to a UV ray incident thereon from below. Hereinafter, embodiments including the UV-blocking member or structure will be explained.

Figure 5:
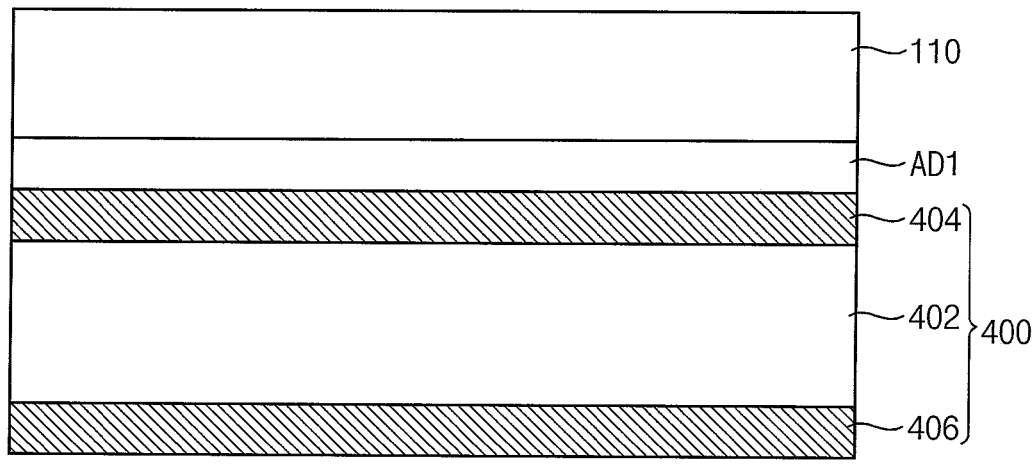
FIGS. 5 to 10 are enlarged schematic cross-sectional views illustrating a display device according to embodiments.
Figure 6:
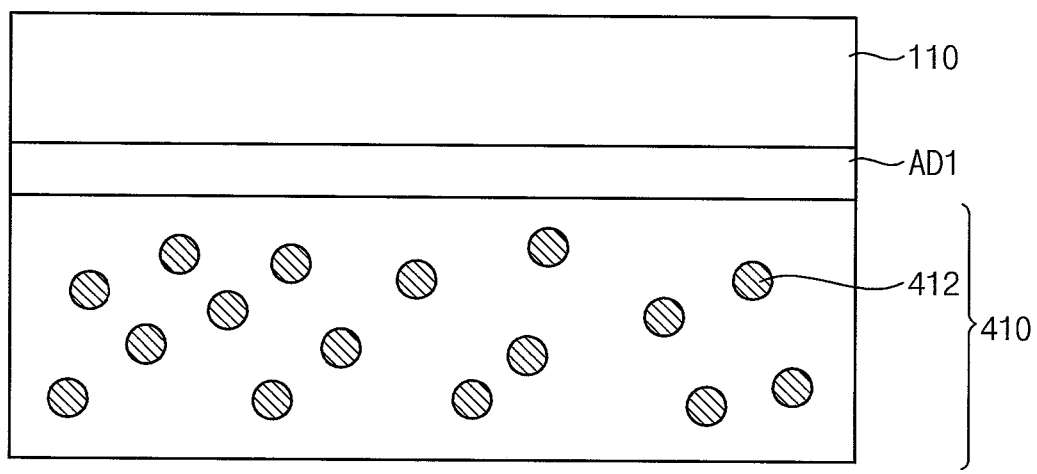

FIGS. 5 to 10 are enlarged schematic cross-sectional views illustrating a display device according to embodiments. For example, FIGS. 5 and 6 illustrate a base substrate and a supporting film, and FIGS. 7 to 10 illustrate a buffer layer, a base substrate and a supporting film.

Referring to FIG. 5, a supporting film 400 may include a supporting layer 402 and a UV-blocking layer combined with or disposed on at least a surface of the supporting layer 402. In an embodiment, the supporting film 400 may include a first UV-blocking layer 404 disposed between the supporting layer 402 and the lower adhesive member AD1 and a second UV-blocking layer 406 combined with or disposed on a lower surface of the supporting layer 402.

The first and second UV-blocking layers 404 and 406 may include a metal oxide capable of absorbing a UV ray. For example, the first and second UV-blocking layers 404 and 406 may include zinc oxide, titanium oxide or other suitable metal oxides or other materials within the spirit and the scope of the disclosure. In view of manufacturing processes and efficiency, the first and second UV-blocking layers 404 and 406 may preferably include zinc oxide or other such oxide that achieves manufacturing efficiency.

For example, a metal oxide layer may be deposited on the supporting layer 402, or a paste including a metal oxide may be coated on the supporting layer 402 to form the first and second UV-blocking layers 404 and 406.

In an embodiment, the first and second UV-blocking layers 404 and 406 may include an inorganic pigment, an organic pigment, a dye, a carbon-based light-blocking material such as carbon black, or the like, which may absorb a UV ray.

Referring to FIG. 6, a supporting film 410 may include UV-blocking particles 412 dispersed in the supporting film 410. The UV-blocking particles 412 may include the above-described UV-blocking materials.

Figure 7:
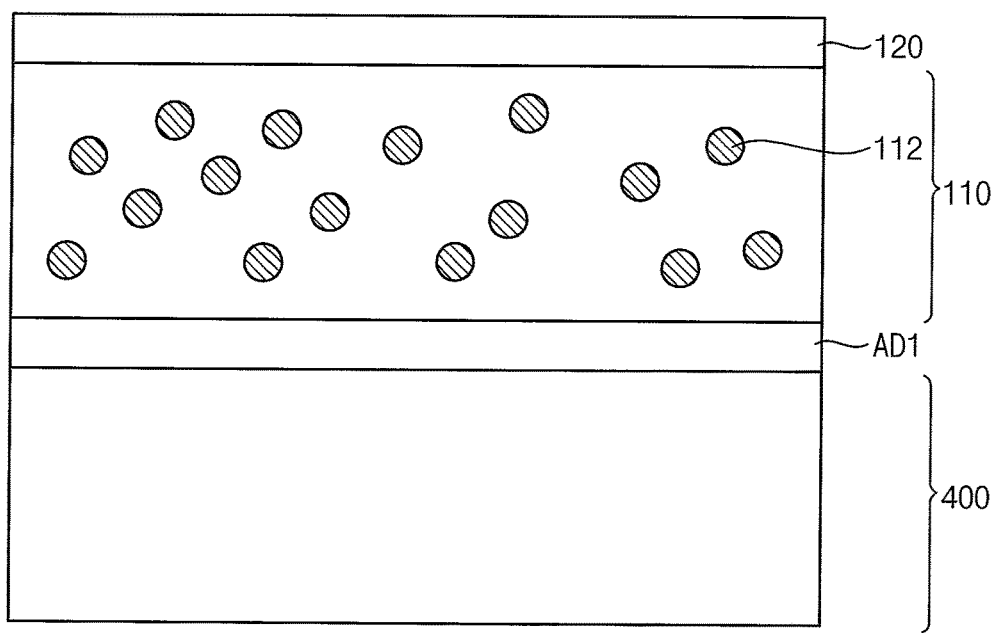

Referring to FIG. 7, a base substrate 110 may include UV-blocking particles 112 dispersed in the base substrate 110. The UV-blocking particles 112 may include the above-described UV-blocking materials.

Figure 8:
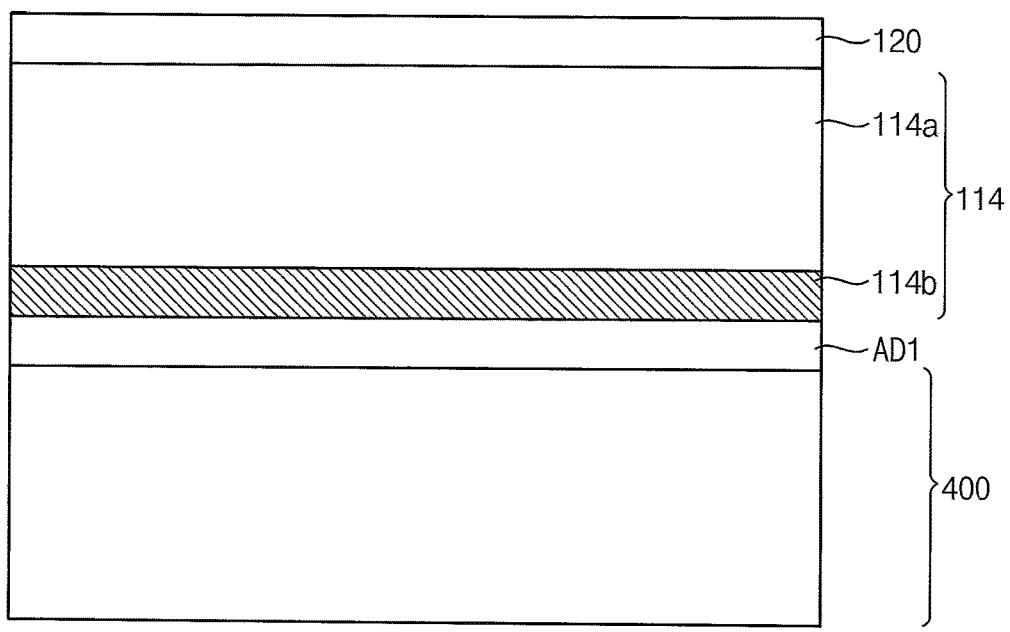

Referring to FIG. 8, a base substrate 114 may include a base layer 114a and a UV-blocking layer 114b combined with or disposed on a lower surface of the base layer 114a. The UV-blocking layer 114b may include the above-described UV-blocking materials.

Figure 9:
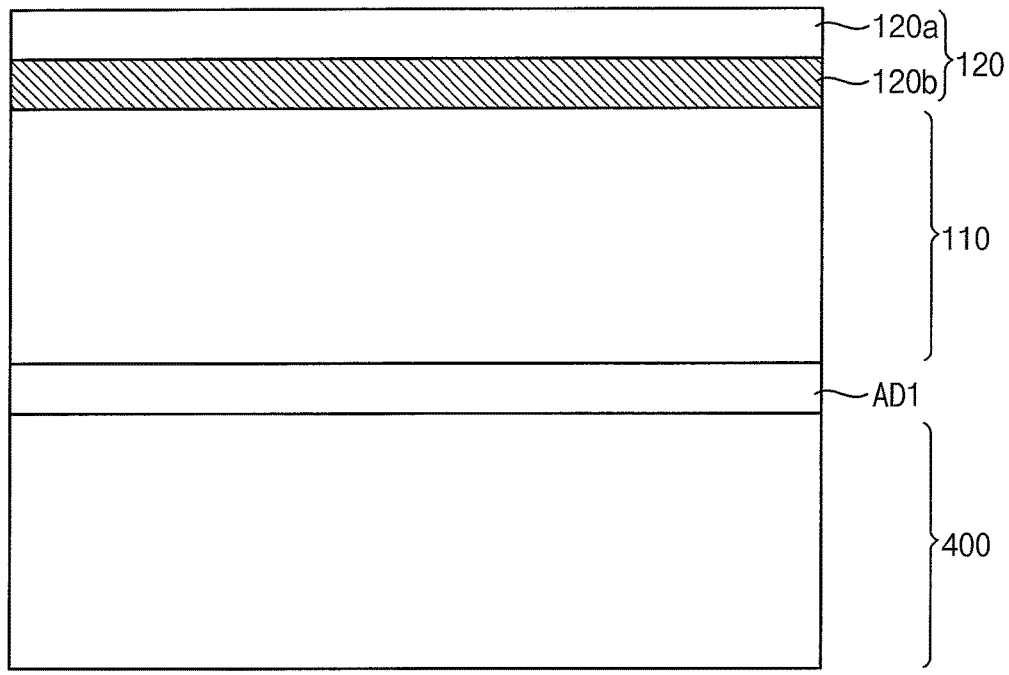

Referring to FIG. 9, a buffer layer 120 may include an upper buffer layer 120a and a UV-blocking layer 120b disposed between the upper buffer layer 120a and a base substrate 110. The upper buffer layer 120a may include silicon oxide, silicon nitride, silicon carbide or a combination thereof. The UV-blocking layer 120b may include the above-described UV-blocking materials.

Figure 10:
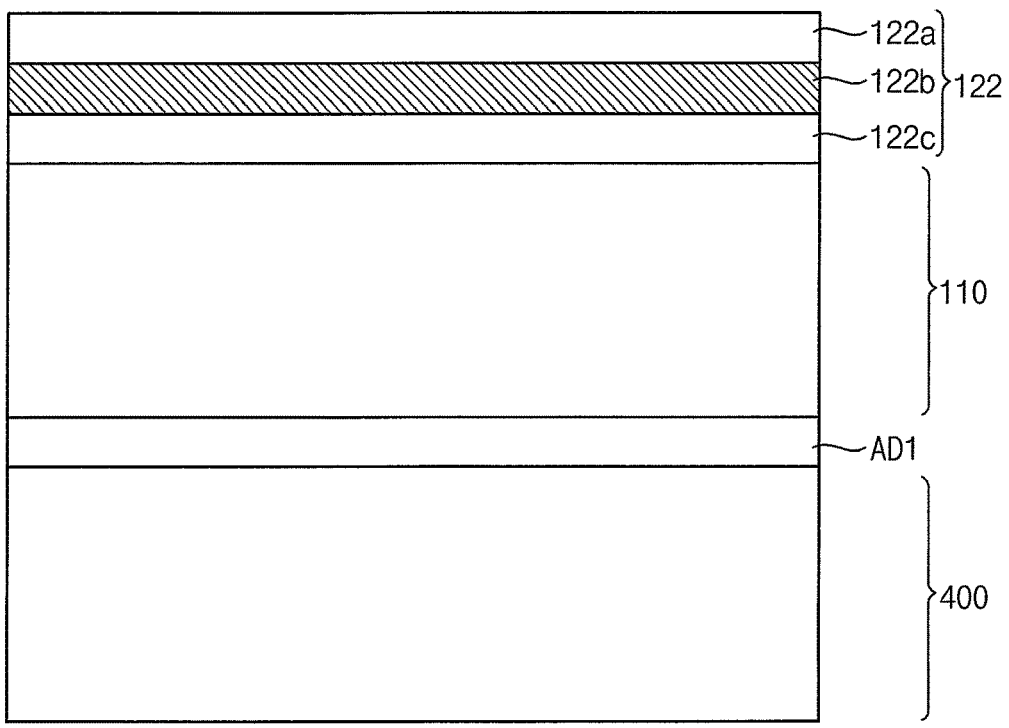

Referring to FIG. 10, a buffer layer 122 may include an upper buffer layer 122a, a lower buffer layer 122c and a UV-blocking layer 122b disposed between the upper buffer layer 122a and the lower buffer layer 122c. In an embodiment, the upper buffer layer 122a may include silicon oxide, and the lower buffer layer 122c may include silicon nitride.

When the UV-blocking layers 120b and 122b include a metal oxide such as zinc oxide, operation of the driving element may be affected by a high conductivity of the UV-blocking layers 120b and 122b. Thus, the UV-blocking layers 120b and 122b in the buffer layers 120 and 122 may be preferably spaced apart from the active pattern.

According to embodiments, a UV-blocking member or structure may be provided below an active pattern of a display device. Thus, deterioration of a driving element including the active pattern due to a UV ray may be prevented.

FIGS. 11 to 14 are schematic cross-sectional views illustrating a method for manufacturing a display device according to an embodiment.

Figure 11:
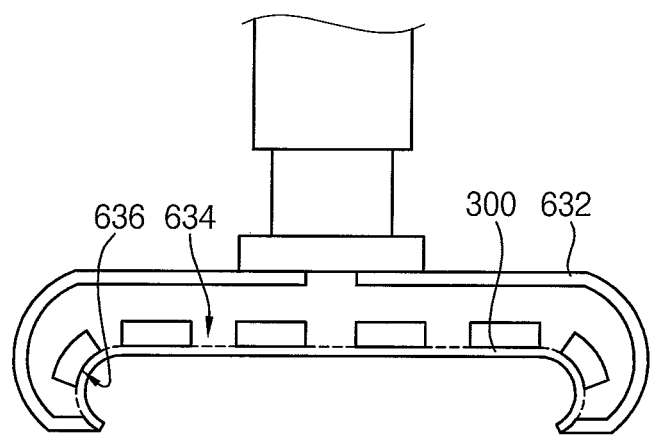
FIGS. 11 to 14 are schematic cross-sectional views illustrating a method for manufacturing a display device according to an embodiment.
Figure 11:
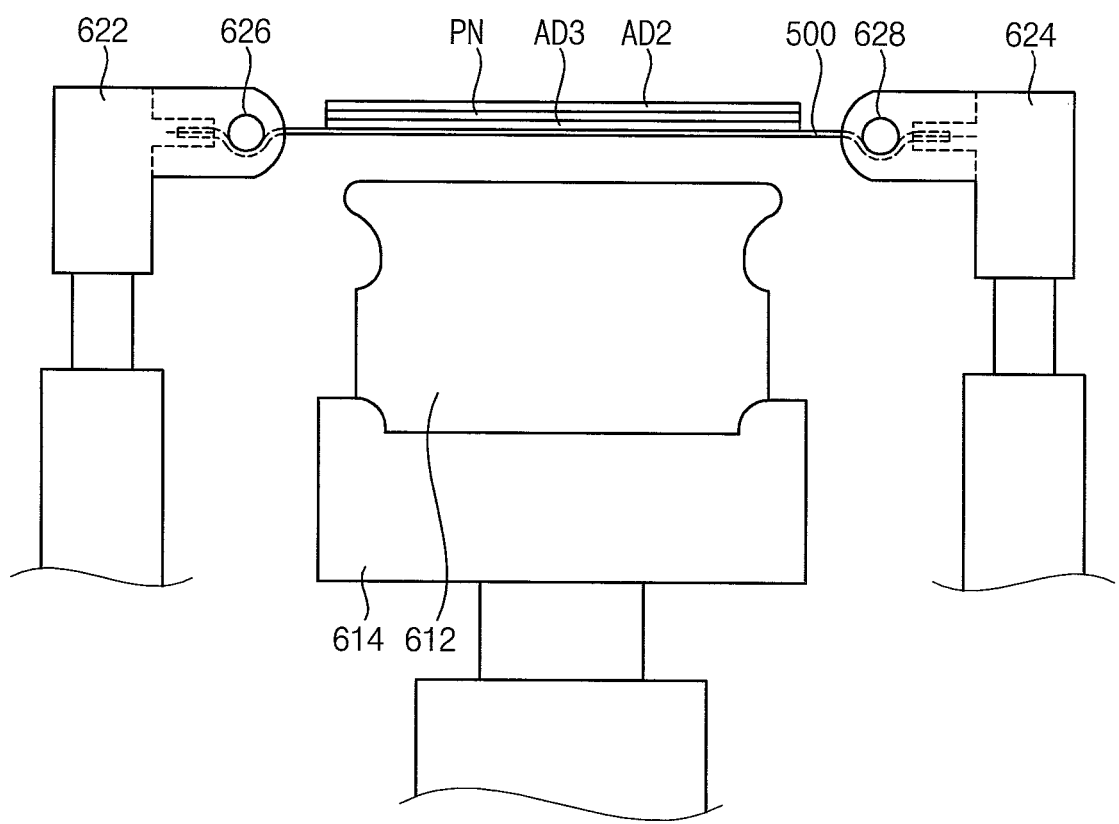

Referring to FIG. 11, a panel part PN of a display device may be disposed on a guide film 500. The guide film 500 may be combined with or adhered to the panel part PN by a guide adhesive member AD3. A window adhesive member AD2 may be combined with or adhered to an upper surface of the panel part PN.

A first end of the guide film 500 may be fixed by a first fixing device 622 and a second end of the guide film 500 may be fixed by a second fixing device 624.

A seating pad 612 may be disposed below the guide film 500. In an embodiment, the seating pad 612 may have a flat upper surface and a curved side surface or curved side surfaces to correspond to a shape of a lower surface of a protective window 300. The seating pad 612 may be disposed on a supporting plate 614.

The protective window 300 may be disposed on the panel part PN combined with or disposed on the guide film 500. The protective window 300 may have a bending edge or bending edges.

The protective window 300 may be fixed by an adsorbing device 632. The adsorbing device 632 may include a contact portion 636 and an adsorbing portion 634 providing a negative pressure (vacuum). The contact portion 636 may have a shape corresponding a bending surface or surfaces of the protective window 300 and may contact an upper surface of the protective window 300.

Figure 12:
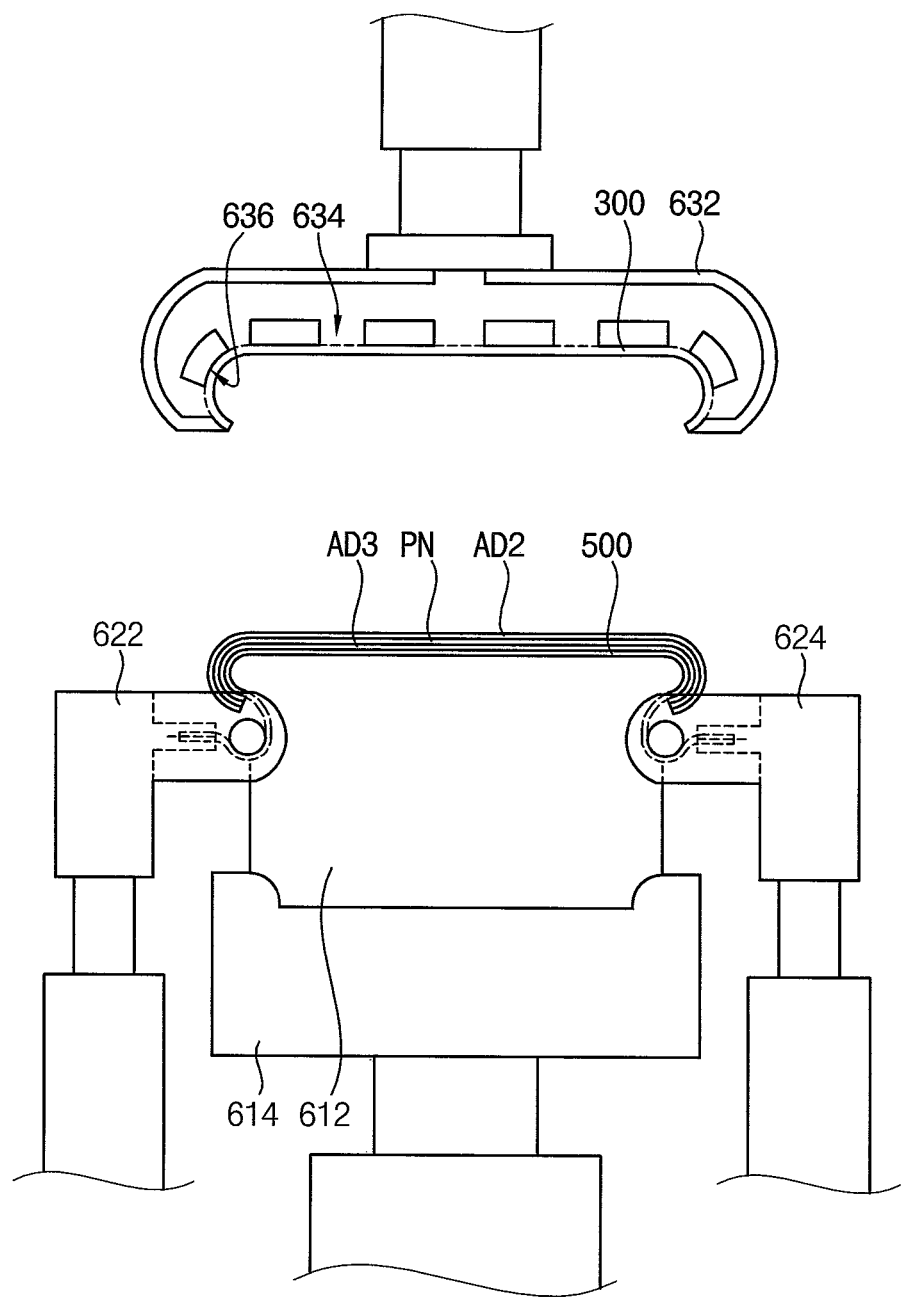

Referring to FIG. 12, the first fixing device 622 and the second fixing device 624 may move downwardly, or the seating pad 612 may move upwardly so that the upper surface of the seating pad 612 may contact the lower surface of the guide film 500.

Thereafter, both ends of the guide film 500 may move so that the guide film 500 may get close to the upper surface and the side surface of the seating pad 612. For example, as illustrated in FIG. 11, a first guide member 626 combined with the first fixing device 622 and a second guide member 628 combined with the second fixing device 624 may move toward the side surface of the seating pad 612. The seating pad 612 may have a groove or grooves formed at the side surface surfaces to guide a position of the guide members 626 and 628.

As a result, the guide film 500, the panel part PN combined with or disposed on the guide film 500 and the window adhesive member AD2 combined with or disposed on the panel part PN may be deformed to have a bending portion or portions along the surface of the seating pad 612.

Figure 13:
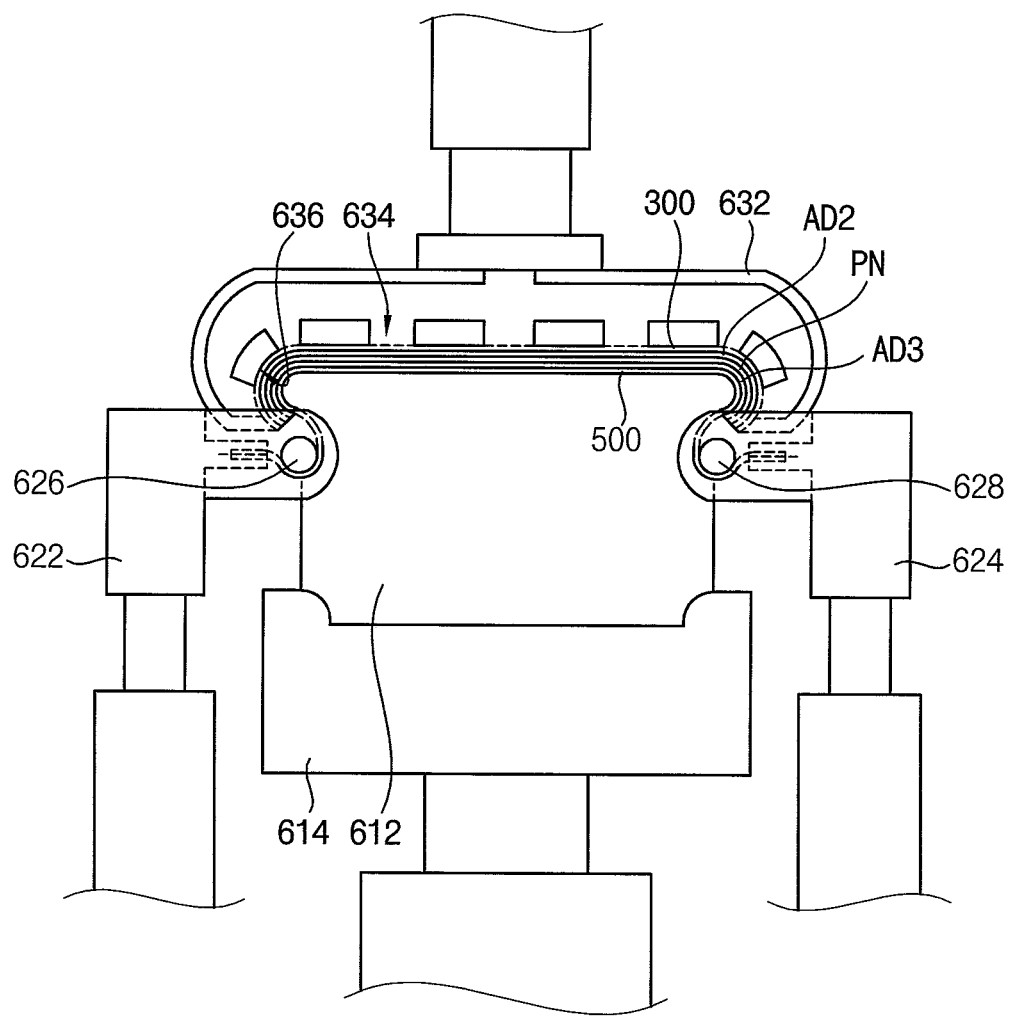

Referring to FIG. 13, the adsorbing device 632 or the seating pad 612 may move vertically so that the protective window 300 may be combined with or disposed on the window adhesive member AD2. Accordingly, the protective window 300 may be combined with or disposed on the panel part PN.

Figure 14:
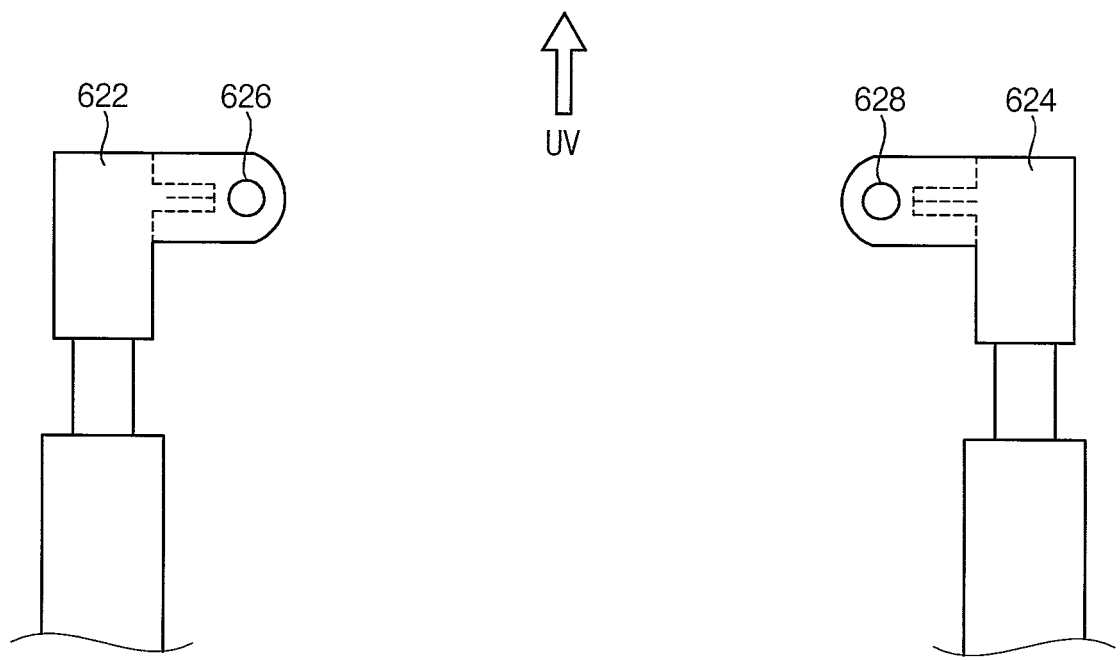

Referring to FIG. 14, the seating pad 612 may be separated from the guide film 500. A UV ray may be irradiated into the guide adhesive member AD3 through the guide film 500.

The guide adhesive member AD3 may include an adhesive that may be separated by UV irradiation. For example, adhesion of the adhesive may be reduced by UV irradiation. Thus, the guide film 500 may be stably separated from the panel part PN.

The lower adhesive member combining the base substrate with the supporting film may include an acrylic adhesive, of which adhesion may not be reduced by UV irradiation. Thus, reliability of the panel part PN may not be reduced in the process of light-exposure.

According to an embodiment, the panel part PN may include a UV-blocking member or structure. Thus, deterioration of a driving element in the panel part PN by a UV ray having high energy may be prevented in the process of separating the guide film 500.

Embodiments may be applied to various display devices. For example, an embodiment may be applied to a vehicle-display device, a ship-display device, an aircraft-display device, portable communication devices, display devices for display or for information transfer, a medical-display device, or other devices within the spirit and the scope of the disclosure.

The foregoing is illustrative of embodiments and is not to be construed as limiting thereof. Although embodiments have been described, those skilled in the art will readily appreciate that many modifications are possible in the embodiments without materially departing from the spirit and the scope of the disclosure. Accordingly, all such modifications are intended to be included within the scope of the disclosure. Therefore, it is to be understood that the foregoing is illustrative of various embodiments and is not to be construed as limited to the embodiments disclosed, and that modifications to the disclosed embodiments, as well as other embodiments, are intended to be included within the spirit and scope of the disclosure, as set forth in the following claims and equivalents thereof.

What is claimed is:

1. A display device comprising:
    a panel part including:
        a base substrate;
        a supporting film including a supporting layer and at least one UV-blocking layer on a surface of the supporting layer and disposed below the base substrate, the supporting layer including a polymeric material;
        a driving element disposed on the base substrate, the driving element including an active pattern; and
        a UV-blocking member disposed on another surface of the supporting layer below the base substrate; and
    a protective window disposed on the panel part.

2. The display device of claim 1, wherein the UV-blocking member includes at least one selected from the group consisting of a metal oxide, a dye, a pigment and a carbon-based light-blocking material.

3. The display device of claim 1, wherein the UV-blocking member includes a UV-blocking layer disposed on at least one surface of the supporting film.

4. The display device of claim 1, wherein the UV-blocking member includes UV-blocking particles dispersed in the supporting film.

5. The display device of claim 1, wherein the UV-blocking member includes a UV-blocking layer disposed on a lower surface of the base substrate.

6. The display device of claim 1, wherein the UV-blocking member includes at least one selected from the group consisting of zinc oxide and titanium oxide.

7. The display device of claim 1, wherein the display device includes:
    a front portion having a flat shape; and
    a side portion including a bending portion having a curved or bent shape.

8. A method for manufacturing a display device, the method comprising:
    disposing a UV-blocking member in a panel part of the display device;
    combining the panel part with a guide film by a guide adhesive member;
    placing a lower surface of the guide film on a seating pad;
    forming a bending portion of the panel part by pressing the guide film to an upper surface and a side surface of the seating pad;
    combining the panel part with a protective window;
    separating the seating pad from the guide film;
    irradiating a UV ray onto the guide adhesive member through the lower surface of the guide film; and
    separating the guide film from the panel part.

9. The method of claim 8, further comprising:
    providing a groove at a side surface of the seating pad, wherein ends of the guide film are guided by the groove to form the bending portion.

10. The method of claim 8, further comprising:
    forming the seating pad such that the upper surface has a flat shape and the side surface has a curved shape.

11. The method of claim 8, wherein the disposing the UV-blocking member includes:
    preparing the UV-blocking member to include at least one selected from the group consisting of a metal oxide, a dye, a pigment and a carbon-based light-blocking material.

12. The method of claim 8, further comprising:
    disposing a supporting film in the panel part; and disposing a UV-blocking layer on a surface of the supporting film to include the UV-blocking layer in the UV-blocking member.

13. The method of claim 8, further comprising:
disposing a supporting film in the panel part; and
dispersing UV-blocking particles in the supporting film to include the UV-blocking particles in the UV-blocking member.

14. The method of claim 8, further comprising:
disposing a base substrate in the panel part; and
disposing a UV-blocking layer on a surface of the base substrate to include the UV-blocking layer in the UV-blocking member.

15. The method of claim 8, further comprising:
disposing a base substrate in the panel part; and
dispersing UV-blocking particles in the base substrate to include the UV-blocking particles in the UV-blocking member.

16. The method of claim 8, further comprising:
disposing a buffer layer between a base substrate and an active pattern included in the panel part; and
disposing a UV-blocking layer between the buffer layer and the base substrate to include the UV-blocking layer in the UV-blocking member.

17. The method of claim 8, further comprising:
disposing a buffer layer between a base substrate and an active pattern included in the panel part, the buffer layer including an upper buffer layer and a lower buffer layer; and
disposing a UV-blocking layer between the upper buffer layer and the lower buffer layer to include the UV-blocking layer in the UV-blocking member.

* * * * *